(12) United States Patent
Abe et al.

(10) Patent No.: US 10,816,681 B2
(45) Date of Patent: Oct. 27, 2020

(54) RADIATION DETECTOR AND MANUFACTURING METHOD FOR RADIATION DETECTOR

(71) Applicant: HAMAMATSU PHOTONICS K.K., Hamamatsu-shi, Shizuoka (JP)

(72) Inventors: Keiji Abe, Hamamatsu (JP); Toshiyuki Izawa, Hamamatsu (JP); Koei Yamamoto, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 356 days.

(21) Appl. No.: 15/773,618

(22) PCT Filed: Oct. 28, 2016

(86) PCT No.: PCT/JP2016/082051
§ 371 (c)(1),
(2) Date: May 4, 2018

(87) PCT Pub. No.: WO2017/082081
PCT Pub. Date: May 18, 2017

(65) Prior Publication Data
US 2020/0257006 A1    Aug. 13, 2020

(30) Foreign Application Priority Data
Nov. 9, 2015   (JP) .................................. 2015-219211

(51) Int. Cl.
*G01T 1/24*    (2006.01)
*H01L 27/30*   (2006.01)
(Continued)

(52) U.S. Cl.
CPC .......... *G01T 1/241* (2013.01); *H01G 9/0036* (2013.01); *H01G 9/2009* (2013.01);
(Continued)

(58) Field of Classification Search
None
See application file for complete search history.

(56) References Cited

U.S. PATENT DOCUMENTS

2014/0110587 A1    4/2014  Ohashi et al.
2016/0248028 A1*   8/2016  Huang ................... C30B 7/08
(Continued)

FOREIGN PATENT DOCUMENTS

JP    2000-256098 A    9/2000
JP    2011-54638 A     3/2011

OTHER PUBLICATIONS

Náfrádi, Bálint, et al., "Methylammonium Lead Iodide for Efficient X-ray Energy Conversion," The Journal of Physical Chemistry C, vol. 119, Oct. 2015, pp. 25204-25208.
(Continued)

*Primary Examiner* — Edwin C Gunberg
(74) *Attorney, Agent, or Firm* — Faegre Drinker Biddle & Reath LLP

(57) ABSTRACT

A radiation detector includes a substrate including a charge collection electrode, a radiation absorption layer disposed on one side with respect to the substrate and including perovskite structure particles and a binder resin; and a voltage application electrode disposed on the one side with respect to the radiation absorption layer, a bias voltage being applied to the voltage application electrode so that a potential difference is generated between the voltage application electrode and the charge collection electrode.

8 Claims, 4 Drawing Sheets

(51) Int. Cl.
H01L 51/00 (2006.01)
H01G 9/20 (2006.01)
H01L 51/42 (2006.01)
H01G 9/00 (2006.01)

(52) U.S. Cl.
CPC ......... *H01G 9/2018* (2013.01); *H01L 27/308* (2013.01); *H01L 51/0004* (2013.01); *H01L 51/0014* (2013.01); *H01L 51/426* (2013.01)

(56) References Cited

U.S. PATENT DOCUMENTS

2017/0170412 A1* 6/2017 Kanitz .................. H01L 51/424
2017/0293037 A1* 10/2017 Schmidt ................ H01L 51/441

OTHER PUBLICATIONS

Stoumpos, Constantinos C., et al., "Crystal Growth of the Perovskite Semiconductor $CsPbBr_3$: A New Material for High-Energy Radiation Detection," Crystal Growth & Design, Jul. 2013, vol. 13, No. 7, pp. 2722-2727.
Yakunin, Sergii, et al., "Detection of X-ray photons by solution-processed lead halide perovskites," Nature Photonics, vol. 9, May 25, 2015, pp. 444-449.
International Preliminary Report on Patentability dated May 24, 2018 for PCT/JP2016/082051.
Hua-Rong Xia et al, "Hydrothermal synthesis of organometal halide perovskites for Li-ion batteries", Chemical Communications, vol. 51, No. 72, Jul. 22, 2015, p. 13787-p. 13790, XP055498927.

* cited by examiner

RADIATION DETECTOR AND MANUFACTURING METHOD FOR RADIATION DETECTOR

TECHNICAL FIELD

The present disclosure relates to a radiation detector and a method of manufacturing a radiation detector.

BACKGROUND ART

Perovskite materials have been suggested as materials applicable to a radiation absorption layer of a radiation detector. Since perovskite materials are inexpensive as compared with CsI, a-Se, CdTe, or the like, perovskite materials are expected to have superiority in fields in which large-area radiation detectors are required (for example, the medical field or the non-destructive inspection field). Non Patent Literature 1 describes a direct conversion type radiation detector including a radiation absorption layer formed using a spray coating of a perovskite material.

CITATION LIST

Patent Literature

Non Patent Literature

[Non Patent Literature 1] "Detection of X-ray photons by solution-processed lead halide perovskites," NATURE PHOTONICS, UK, Nature Publishing Group, May 25, 2015, Vol. 9, p. 444-449

SUMMARY OF INVENTION

Technical Problem

A thickness of the radiation absorption layer as described above is, for example, preferably 100 μm or more from the viewpoint of improvement of radiation absorption efficiency. However, in a spray coating of a perovskite material, only a film of about several tens of nm can be formed in one step. Therefore, the radiation detector described in Non Patent Literature 1 is not realistic from the viewpoint of mass producibility.

Therefore, an object of the present disclosure is to provide a radiation detector that is excellent in mass producibility and a method of manufacturing the radiation detector.

Solution to Problem

A radiation detector according to an aspect of the present disclosure includes a substrate including a charge collection electrode; a radiation absorption layer disposed on one side with respect to the substrate and including perovskite structure particles and a binder resin; and a voltage application electrode disposed on the one side with respect to the radiation absorption layer, a bias voltage being applied to the voltage application electrode so that a potential difference is generated between the voltage application electrode and the charge collection electrode.

In this radiation detector, since the radiation absorption layer contains the perovskite structure particles and the binder resin, it is possible to easily thicken the radiation absorption layer, for example, using a particle in binder (PIE) method. Therefore, this radiation detector is excellent in mass producibility.

In the radiation detector according to the aspect of the present disclosure, the radiation absorption layer may further include inorganic semiconductor particles other than the perovskite structure particles. Accordingly, it is possible to increase mobility of charge (electrons and holes) generated in the radiation absorption layer due to absorption of radiation and to obtain sufficient sensitivity and response characteristics.

In the radiation detector according to the aspect of the present disclosure, an average particle diameter of the perovskite structure particles may be larger than an average particle diameter of the inorganic semiconductor particles. Accordingly, it is possible to improve radiation absorption efficiency and sensitivity.

The radiation detector according to the aspect of the present disclosure may further include a semiconductor charge collection layer disposed between the substrate and the radiation absorption layer. Accordingly, charge (electrons or holes) generated in the radiation absorption layer due to absorption of radiation can be smoothly moved to the charge collection electrode.

In the radiation detector according to the aspect of the present disclosure, a conductivity type of the inorganic semiconductor particles and a conductivity type of the semiconductor charge collection layer may be the same. Accordingly, charge (electrons or holes) generated in the radiation absorption layer due to absorption of radiation can be moved to the charge collection electrode more smoothly.

The radiation detector according to the aspect of the present disclosure may further include a hole transport layer disposed between the radiation absorption layer and the voltage application electrode. Accordingly, when a bias voltage is applied to the voltage application electrode so that a negative potential difference is generated with respect to the charge collection electrode, holes generated in the radiation absorption layer due to absorption of radiation can be smoothly moved to the voltage application electrode.

A method for manufacturing a radiation detector according to an embodiment of the present disclosure includes a first step of preparing a coating solution containing perovskite structure particles, a binder resin, and an organic solvent; a second step of forming a radiation absorption layer on one side with respect to a substrate including a charge collection electrode through screen printing using the coating solution after the first step, the radiation absorption layer containing the perovskite structure particles and the binder resin; and a third step of forming a voltage application electrode on the one side with respect to the radiation absorption layer after the second step, a bias voltage being applied to the voltage application electrode such that a potential difference is generated between the voltage application electrode and the charge collection electrode.

In this method of manufacturing a radiation detector, since screen printing is used for formation of the radiation absorption layer, it is possible to easily thicken the radiation absorption layer. Therefore, the method of manufacturing the radiation detector is excellent in mass producibility of the radiation detector.

The method of manufacturing a radiation detector according to the embodiment of the present disclosure may further include a step of pulverizing a perovskite structure crystal block to obtain the perovskite structure particles before the first step. Accordingly, since the perovskite structure particles of which the particle diameter is reduced in a random state can be obtained, a filling rate of the perovskite structure particles in the radiation absorption layer increases. Thus, it is possible to obtain the radiation absorption layer excellent in radiation absorption efficiency and sensitivity.

Advantageous Effects of Invention

According to the present disclosure, it is possible to provide a radiation detector excellent in mass producibility and a method for manufacturing the radiation detector.

DESCRIPTION OF EMBODIMENTS

Figure 1:
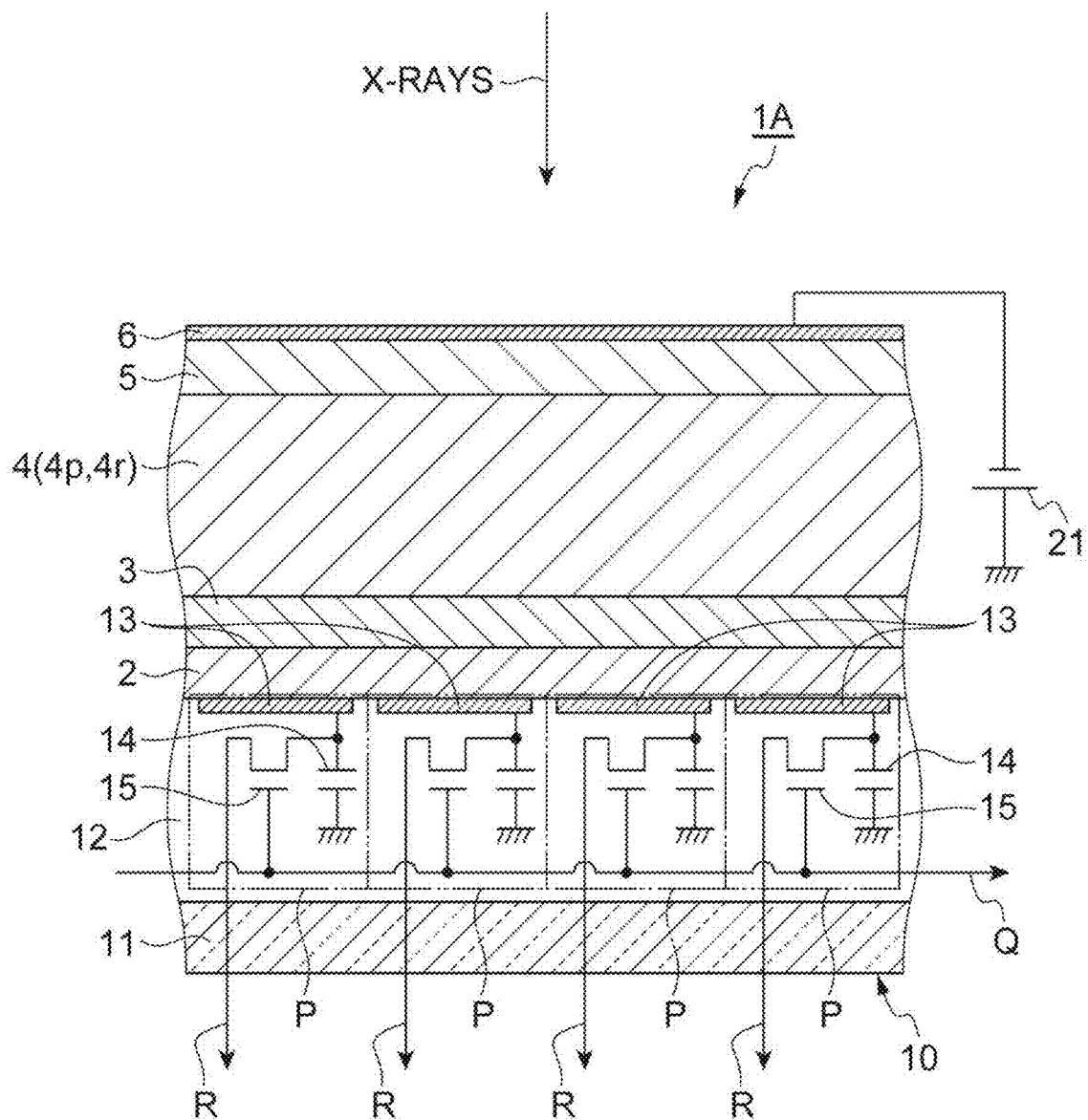
FIG. 1 is a partial cross-sectional view of a radiation detector according to a first embodiment of the present disclosure.

Hereinafter, embodiments of the present disclosure will be described in detail with reference to the drawings. In respective figures, the same or corresponding parts are denoted by the same reference numerals, and duplicate description will be omitted.

First Embodiment

As illustrated in FIG. 1, a radiation detector 1A includes a panel (substrate) 10, a dense layer (semiconductor charge collection layer) 2, a porous layer (semiconductor charge collection layer) 3, a radiation absorption layer 4, a hole transport layer 5, and a voltage application electrode 6. In the radiation detector 1A, the dense layer 2, the porous layer 3, the radiation absorption layer 4, the hole transport layer 5 and the voltage application electrode 6 are laminated in this order on a surface on one side of a panel 10. The radiation detector 1A is, for example, a solid-state imaging device that detects X-rays as radiation to form an X-ray transmission image.

The panel 10 includes a support substrate 11 formed of an insulating material such as glass, and a functional layer 12 in which a plurality of pixels P are provided. Each pixel P includes a charge collection electrode 13, a capacitor 14, and a thin film transistor 15. One electrode of the capacitor 14 is electrically connected to the charge collection electrode 13. The other electrode of the capacitor 14 is grounded. One current terminal of the thin film transistor 15 is electrically connected to a wiring which electrically connects the one electrode of the capacitor 14 to the charge collection electrode 13. The other current terminal of the thin film transistor 15 is electrically connected to a reading wiring R. A control terminal of the thin film transistor 15 is electrically connected to a row selection wiring Q.

The thin film transistor 15 is formed of a field effect transistor (FET) or a bipolar transistor. When the thin film transistor 15 is configured of an FET, the control terminal corresponds to a gate, and the current terminal corresponds to a source or a drain. When the thin film transistor 15 is a bipolar transistor, the control terminal corresponds to a base, and the current terminal corresponds to a collector or an emitter.

Figure 2:
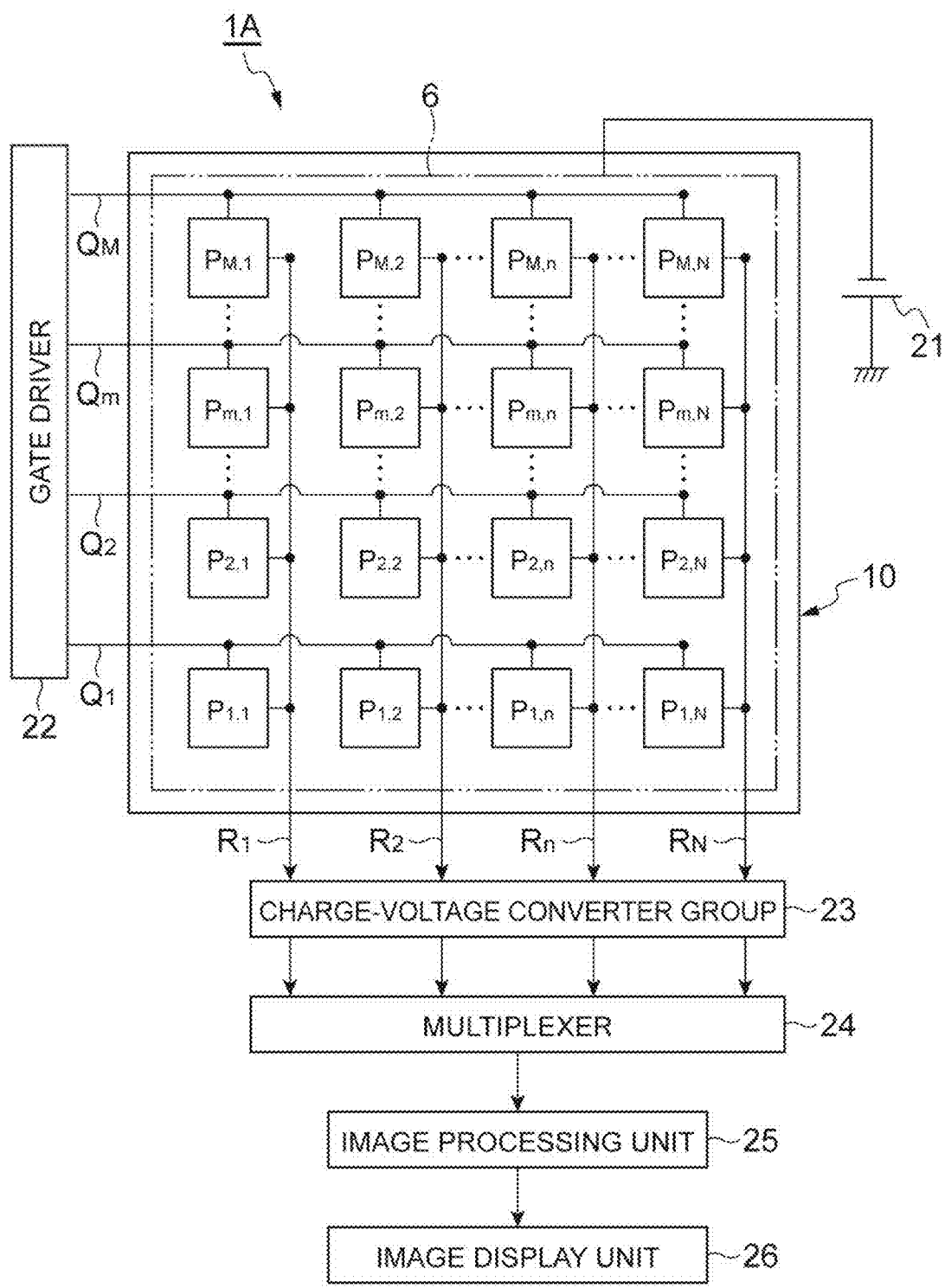
FIG. 2 is a configuration diagram of the radiation detector of FIG. 1.

As illustrated in FIG. 2, in the panel 10, a plurality of pixels P are arranged in a matrix form. A pixel $P_{m,n}$ is a pixel that is located in an m-th row and an n-th column. m is an integer equal to or greater than 1 and equal to or smaller than M (an integer equal to or greater than 2), and n is an integer equal to or greater than 1 and equal to or smaller than N (an integer equal to or greater than 2). The control terminal of the thin film transistor 15 included in each of the N pixels $P_{m,n}$ arranged in the m-th row is electrically connected to one row selection wiring Qm arranged in the m-th row. The other current terminal of the thin film transistor 15 included in each of the M pixels $P_{m,n}$ arranged in the n-th column is electrically connected to one reading wiring Rn arranged in the n-th column.

As illustrated in FIG. 1, the radiation absorption layer 4 is disposed on one side with respect to the panel 10 to cover all the pixels P of the panel 10 when viewed in a incidence direction of X-rays. The radiation absorption layer 4 contains perovskite structure particles 4p and a binder resin 4r. The perovskite structure particles 4p are formed of a methylammonium lead halide such as $CH_3NH_3PbCl_xBr_yI_{(3-x-y)}$ (0<x+y<3), $CH_3NH_3PbCl_xI_{(3-x)}$ (0<x<3), $CH_3NH_3PbCl_3$, $CH_3NH_3PbBr_3$, or $CH_3NH_3PbI_3$. The binder resin 4r is, for example, an acrylic organic resin, polyimide, polyvinyl alcohol, polyethylene, polyester, polycarbonate, or a polyurethane organic resin. When the incident X-rays are absorbed by the radiation absorption layer 4, charge (electrons and holes) are generated according to the amount of absorption.

A thickness of the radiation absorption layer 4 is preferably 1 μm to 2 mm. However, from the viewpoint of improvement of absorption efficiency of X-rays, the thickness of the radiation absorption layer 4 is preferably 100 μm or more. On the other hand, from the viewpoint of suppression of disappearance of the charge generated by the absorption of X-rays (that is, disappearance due to recombination of electrons and holes) and improvement of collection efficiency of the charge, the thickness of the radiation absorption layer 4 is preferably 1 mm or less. A ratio $C_B/C_A$ of a film density $C_B$ of the radiation absorption layer 4 to a density $C_A$ of the perovskite structure particle 4p is preferably 0.1 to 1. From the viewpoint of improvement of mobility of the charge generated due to the absorption of the X-rays and absorption efficiency of the X-rays, the ratio is more preferably 0.5 or more. $C_A$ and $C_B$ mean a density or a film density that is measured under conditions of a temperature of 25° C. and an atmospheric pressure of 1 atm.

The dense layer 2 is disposed between the panel 10 and the radiation absorption layer 4 to cover all the pixels P of the panel 10 when viewed in the incidence direction of the X-rays. The dense layer 2 is formed of an n-type semiconductor material. As the n-type semiconductor material, an n-type metal oxide semiconductor (for example, a metal oxide such as titanium oxide ($TiO_2$), tin oxide ($SnO_2$), zinc oxide (ZnO), iron oxide ($Fe_2O_3$), tungsten oxide ($WO_3$), zirconium oxide ($ZrO_5$), strontium oxide (SrO), indium oxide ($In_2O_3$), cerium oxide ($CeO_2$), yttrium oxide ($Y_2O_3$), lanthanum oxide ($La_2O_3$), vanadium oxide ($V_2O_5$), niobium oxide ($Nb_2O_3$), tantalum oxide ($Ta_2O_5$), and nickel oxide (NiO)) is preferable. The dense layer 2 receives the electrons and causes the electrons to be collected on the side of the charge collection electrode 13 while preventing injection of the holes among the charge generated in the radiation absorption layer 4 due to the absorption of the X-rays. The thickness of the dense layer 2 is, for example, 1 nm to 1 μm.

The porous layer 3 is disposed between the dense layer 2 and the radiation absorption layer 4 to cover all the pixels P of the panel 10 when viewed in the incidence direction of X-rays. The porous layer 3 is formed of an n-type semiconductor material. As the n-type semiconductor material, an n-type metal oxide semiconductor (for example, a metal oxide such as titanium oxide ($TiO_2$), tin oxide ($SnO_2$), zinc oxide (ZnO), iron oxide ($Fe_2O_3$), tungsten oxide ($WO_3$), zirconium oxide ($ZrO_5$), strontium (SrO), indium oxide ($In_2O_3$), cerium oxide ($CeO_2$), yttrium oxide ($Y_2O_3$), lanthanum oxide ($La_2O_3$), vanadium oxide ($V_2O_5$), niobium oxide ($Nb_2O_3$), tantalum oxide ($Ta_2O_5$), and nickel oxide (NiO)) is preferable. The porous layer 3 receives the electrons and causes the electrons to be collected on the side of the charge collection electrode 13 while preventing injection of the holes among the charge generated in the radiation absorption layer 4 due to the absorption of the X-rays. Further, the porous layer 3 increases a surface area of the radiation absorption layer 4 that comes in contact with the porous layer 3, thereby improving absorption efficiency of the X-rays in the radiation absorption layer 4. A thickness of the porous layer 3 is, for example, 0.1 nm to 10 μm.

The voltage application electrode 6 is disposed on one side with respect to the radiation absorption layer 4 to cover all the pixels P of the panel 10 when viewed in the incidence direction of the X-rays. The voltage application electrode 6 is formed of a metal such as aluminum, gold, silver, platinum, or titanium, a conductive metal oxide such as tin-doped indium oxide (ITO), fluorine-added tin oxide (FTO), tin oxide ($SnO_2$), indium zinc oxide (IZO), or zinc oxide (ZnO), or an organic conductive material containing a conductive polymer or the like. A bias voltage is applied to the voltage application electrode 6 by a bias voltage supply power supply 21 so that a negative potential difference is generated between the voltage application electrode 6 and the charge collection electrode 13 of each pixel P.

The hole transport layer 5 is disposed between the radiation absorption layer 4 and the voltage application electrode 6 to cover all the pixels P of the panel 10 when viewed in the incidence direction of X-rays. The hole transport layer 5 is formed of a p-type semiconductor material. As the p-type semiconductor material, for example, copper iodide (CuI), copper thiocyanate (CuSCN), molybdenum oxide ($MoO_3$), nickel oxide (NiO), or the like is suitable. One of these may be used alone, or two or more of these may be used in combination. The hole transport layer 5 receives the holes and transports the holes to the voltage application electrode 6 while preventing the injection of the electrons among the charge generated in the radiation absorption layer 4 due to the absorption of X-rays. A thickness of the hole transport layer 5 is, for example, 10 nm to 10 μm.

The radiation detector 1A configured as described above is used as follows. As illustrated in FIG. 2, the voltage application electrode 6 of the radiation detector 1A is electrically connected to the bias voltage supply power supply 21. The row selection wiring Qm of the radiation detector 1A is electrically connected to a gate driver 22, and the reading wiring Rn of the radiation detector 1A is electrically connected to a multiplexer 24 via a charge-voltage converter group 23. Further, the multiplexer 24 is electrically connected to an image processing unit 25, and the image processing unit 25 is electrically connected to an image display unit 26. Note that the gate driver 22, the charge-voltage converter group 23, the multiplexer 24, and the like may be formed in the panel 10 as a configuration of the radiation detector 1A.

In this state, as illustrated in FIG. 1, when the X-rays with which an imaging target has been irradiated are incident on the radiation absorption layer 4 and the X-rays are absorbed in the radiation absorption layer 4, charge (electrons and holes) is generated according to the amount of absorption of the X-rays in the radiation absorption layer 4. In this case, a bias voltage is applied to the voltage application electrode 6 by the bias voltage supply power supply 21 so that a negative potential difference is generated between the voltage application electrode 6 and the charge collection electrode 13 of each pixel P. Therefore, among charge generated in the radiation absorption layer 4 due to the absorption of the X-rays, the electrons are collected in the charge collection electrode 13 of each pixel P via the porous layer 3 and the dense layer 2 due to an action of the bias voltage, and accumulated in the capacitor 14 of each pixel P. On the other hand, among the charge generated in the radiation absorption layer 4 due to the absorption of the X-rays, the holes are transported to the voltage application electrode 6 via the hole transport layer 5.

As illustrated in FIGS. 1 and 2, a control signal is transmitted from the gate driver 22 via the row selection wiring Qm of the m-th row, and the thin film transistor 15 of each pixel $P_{m,n}$ of the m-th row is turned ON. The gate driver 22 sequentially performs the transmission of this control signal for all the row selection wirings Qm. Accordingly, the charge accumulated in the capacitor 14 of each pixel $P_{m,m}$ in the m-th row is input to the charge-voltage converter group 23 via the corresponding readout wiring Rn, and a voltage signal according to the amount of charge is input to the multiplexer 24. The multiplexer 24 sequentially outputs the voltage signal according to the amount of charge accumulated in the capacitor 14 of each pixel $P_{m,n}$ to the image processing unit 25. The image processing unit 25 forms an X-ray transmission image of the imaging target on the basis of the voltage signal input from the multiplexer 24, and causes the image display unit 26 to display the X-ray transmission image.

As described above, in the radiation detector 1A, since the radiation absorption layer 4 contains the perovskite structure particles 4p and the binder resin 4r, the radiation absorption layer 4 can easily be thickened using, for example, a PIB method such as screen printing. For example, the screen printing is capable of forming the radiation absorption layer 4 having a predetermined thickness in a shorter time than spray coating. Therefore, the radiation detector 1A is excellent in mass producibility.

Further, in the radiation detector 1A, since the radiation absorption layer 4 contains the perovskite structure particles 4p and the binder resin 4r, the binder resin 4r functions as an insulator and a dark current can be reduced.

Further, in the radiation detector 1A, the dense layer 2 and the porous layer 3 formed of the n-type semiconductor material are disposed between the panel 10 and the radiation absorption layer 4. Accordingly, in a state in which the bias voltage is applied to the voltage application electrode 6 so that the negative potential difference is generated with respect to the charge collection electrode 13, the electrons generated in the radiation absorption layer 4 due to the absorption of the X-rays can be smoothly moved to the charge collection electrode 13.

Further, in the radiation detector 1A, the hole transport layer 5 formed of the p-type semiconductor material is disposed between the radiation absorption layer 4 and the voltage application electrode 6. Accordingly, in a state in which the bias voltage is applied to the voltage application electrode 6 to generate the negative potential difference with respect to the charge collection electrode 13, the holes generated in the radiation absorption layer 4 due to the absorption of the X-rays can be smoothly moved to the voltage application electrode 6.

Next, a method of manufacturing the radiation detector 1A will be described. First, the dense layer 2 is formed on the panel 10 using an atomic layer deposition (ALD) method, a spray pyrolysis depositions (SPD) method, or the like. Subsequently, nanoparticles or microparticles of a metal oxide semiconductor, or a precursor thereof are dispersed in a solvent and adjusted to prepare a viscous colloid or paste. The dense layer 2 is coated with the formed colloid or paste, and the coated layer is heated and sintered to form the porous layer 3 on the dense layer 2.

Subsequently, $CH_3NH_2I$ and $PbX_2$ are mixed in an organic solvent in a molar ratio of 1:1 to prepare a methylammonium lead halide (here, $CH_3NH_3PbX_3$ (X indicates I, Br, or Cl; the same applies hereinafter) that is the perovskite structure particle 4p. The organic solvent may be an organic solvent capable of dissolving $CH_3NH_2I$, $PbX_2$, and the methylammonium lead halide, may be formed of one kind of solvent, or may be formed of two or more kinds of mixed solvents. Examples of the organic solvent include y-butyrolactone, N-methyl-2-pyrrolidone, and N,N-dimethylformamide.

When $PbX_2$ has completely reacted in a solution, the binder resin 4r is added and completely dissolved to prepare a coating solution containing the perovskite structure particles 4p, the binder resin 4r, and the organic solvent (a first step). The binder resin 4r may be a material that is soluble in the above-described organic solvent, may be formed of one type of resin, or may be formed of two or more kinds of mixed resins. Examples of the binder resin 4r include an acrylic organic resin, polyimide, polyvinyl alcohol, polyethylene, polyester, polycarbonate, and a polyurethane organic resin. The amount of addition of the binder resin 4r can be appropriately adjusted in the range of, for example, 5 to 90 wt % on the basis of the total amount of the solution according to the thickness of the radiation absorption layer 4 to be obtained. However, as the amount of addition of the binder resin 4r increases, the charge collection efficiency decreases. Therefore, the amount of addition of the binder resin 4r is preferably 50 wt % or less. On the other hand, when the amount of addition of the binder resin 4r decreases, viscosity of the mixed solution lowers and it becomes difficult to form a predetermined shape. Therefore, the amount of addition of the binder resin 4r is preferably 10 wt % or more.

Subsequently, the radiation absorption layer 4 is formed on the porous layer 3 using screen printing using a coating liquid containing the perovskite structure particles 4p, the binder resin 4r, and the organic solvent (that is, the radiation absorption layer 4 is formed on one side with respect to the panel 10) (a second step). More specifically, a coating layer is formed on the porous layer 3 by coating the porous layer 3 with a coating liquid using screen printing, and the coating layer is dried to volatilize the organic solvent, thereby removing the organic solvent from the coating layer to obtain the radiation absorption layer 4 formed on the porous layer 3.

For formation of the coating layer, a coating method which is not required to be performed in a vacuum environment, such as spray coating, screen printing, or spin coating can be used, but the screen printing is particularly suitable since a paste layer having a thickness of 100 μm or more can be formed in a short time. Drying of the coating layer is preferably performed under an environment from a room temperature to about 150° C. However, when the drying of the coating layer is performed in an environment of a temperature equal to or higher than a boiling point of the organic solvent, there is concern that bubbles may remain in the radiation absorption layer 4. Therefore, it is particularly preferable for the drying of the coating layer to be performed in an environment of a temperature lower than the boiling point of the organic solvent. It is also effective to perform hot pressing on the coated layer after the drying in order to improve a ratio of a film density of the radiation absorption layer 4 to a density of the methylammonium lead halide.

The hole transport layer 5 is formed on the radiation absorption layer 4. The hole transport layer 5 can be formed using spray coating, screen printing, spin coating, or the like, similar to the radiation absorption layer 4. Alternatively, the hole transport layer 5 can be formed using a vapor deposition method, a sputtering method, or the like.

The voltage application electrode 6 is formed on the hole transport layer 5. That is, the voltage application electrode 6 to which the bias voltage is applied to generate a potential difference between the voltage application electrode 6 and the charge collection electrode 13 is formed on the one side with respect to the radiation absorption layer 4 (a third step). The voltage application electrode 6 can be foamed using spray coating, screen printing, spin coating, or the like. Alternatively, the voltage application electrode 6 can be formed using a vapor deposition method, a sputtering method, or the like.

As described above, in the method of manufacturing the radiation detector 1A, since the screen printing is used to form the radiation absorption layer 4, the radiation absorption layer 4 can be easily thickened. Therefore, the method of manufacturing the radiation detector 1A is excellent in mass productivity of the radiation detector 1A.

Second Embodiment

Figure 3:
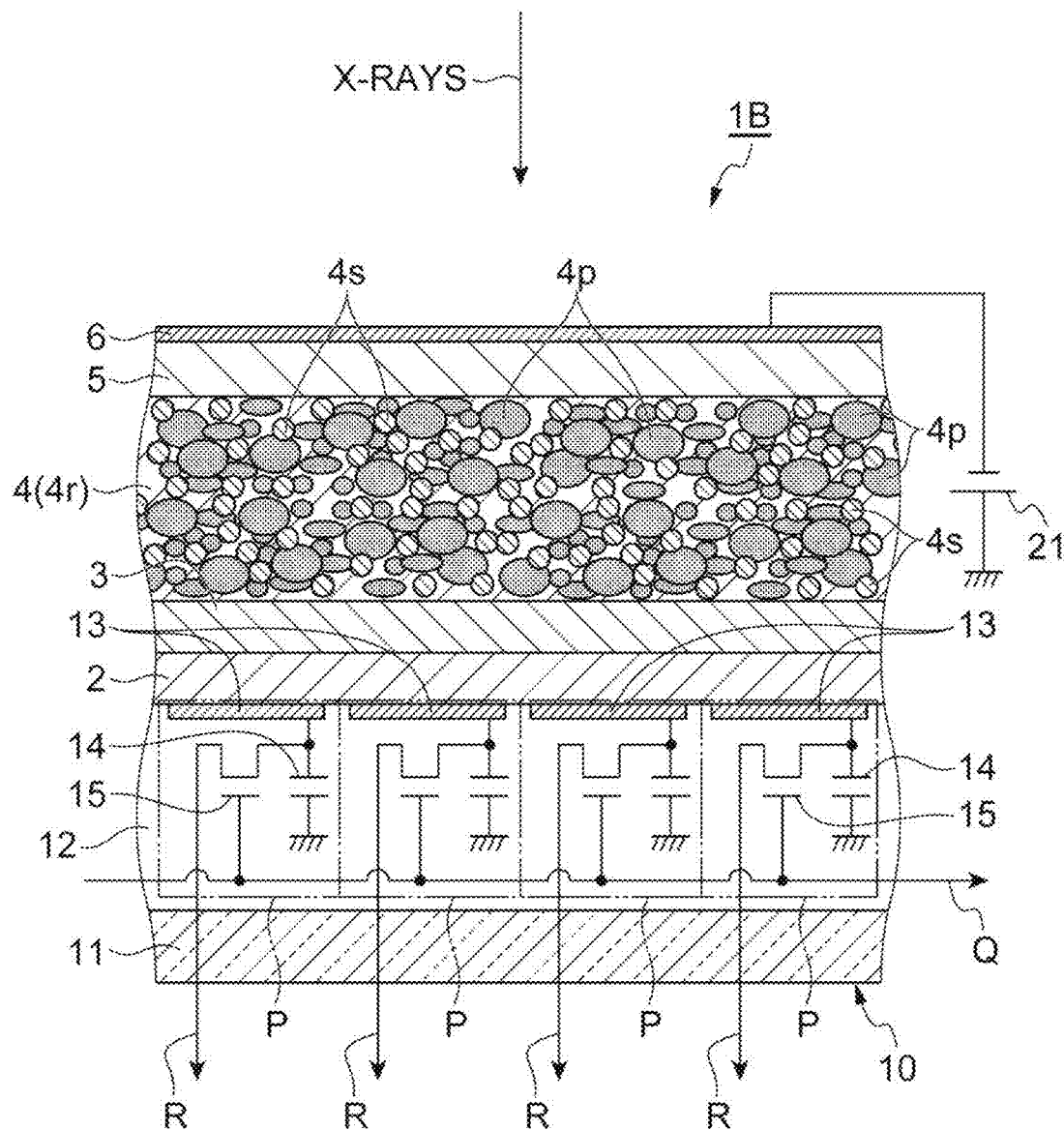
FIG. 3 is a partial cross-sectional view of a radiation detector according to a second embodiment of the present disclosure.

As illustrated in FIG. 3, a radiation detector 1B is different from the radiation detector 1A in the configuration of the radiation absorption layer 4. In the radiation detector 1B, the radiation absorption layer 4 further contains inorganic semiconductor particles 4s other than the perovskite structure particles 4p, in addition to the perovskite structure particles 4p and the binder resin 4r. The inorganic semiconductor particles 4s are formed of an n-type semiconductor material. That is, a conductivity type of the inorganic semiconductor particle 4s is the same as the conductivity type of the dense layer 2 and the porous layer 3. As the n-type semiconductor material, an oxide such as titanium, silicon, zinc, niobium, tin, or aluminum, a sulfide thereof, a halide thereof, or the like is suitable. The inorganic semiconductor particles 4s increase the mobility of the charge generated in the radiation absorption layer 4 due to the absorption of the X-rays.

In the radiation absorption layer 4 containing the perovskite structure particles 4p, electrons have higher mobility than holes. Therefore, it is preferable for an n-type semiconductor material to be selected as the material of the inorganic semiconductor particles 4s. The inorganic semiconductor particles 4s formed of $TiO_2$, $SiO_2$, $GeO_2$, or the like are particularly preferable from the viewpoint of increase of the mobility of the electrons. The inorganic semiconductor particles 4s also function as nuclei for crystal growth of the perovskite material.

The method of manufacturing the radiation detector 1B is the same as the method of manufacturing the radiation detector 1A described above except that the binder resin 4r and the inorganic semiconductor particles 4s are added to the solution in which $PbX_2$ has completely reacted, and are completely dissolved to prepare the coating liquid containing the perovskite structure particles 4p, the inorganic semiconductor particles 4s, the binder resin 4r, and the organic solvent.

In the radiation absorption layer 4, an average particle diameter of the perovskite structure particles 4p is larger than an average particle diameter of the inorganic semiconductor particles 4s. The average particle diameter of the inorganic semiconductor particles 4s is preferably 1 nm to 200 μm. However, when the average particle diameter of the inorganic semiconductor particles 4s is 10 nm or less, cohesion of the inorganic semiconductor particles 4s may occur and the dispersibility of the inorganic semiconductor particles 4s in the radiation absorption layer 4 may deteriorate. Therefore, the average particle diameter of the inorganic semiconductor particles 4s is more preferably 50 nm or more. Further, from the viewpoint of suppression of occurrence of crosstalk between the adjacent charge collection electrodes 13, the average particle diameter of the inorganic semiconductor particles 4s is preferably 50% or less of a pixel pitch of the panel 10 (a distance between centers of the adjacent charge collection electrodes 13). A pulverizing method using a ball mill or a mortar, a sifting method, or the like can be appropriately used to obtain the inorganic semiconductor particles 4s having a desired average particle diameter. The average particle diameter means a particle diameter of primary particles. In the embodiment, the average particle diameter is a particle diameter in a case in which measurement is performed with a laser diffraction particle diameter distribution measurement device SALD-2300 manufactured by Shimadzu Corporation.

The mixing amount of the inorganic semiconductor particles 4s is preferably 70 wt % or less with respect to the mixing amount of the perovskite structure particles 4p. When the mixing amount of the inorganic semiconductor particles 4s increases, there is concern that a resistance value of the radiation absorption layer 4 may decrease and a dark current may increase, or a film density of the radiation absorption layer 4 may decrease and the absorption efficiency of the X-rays may decrease. Therefore, the mixing amount of the inorganic semiconductor particles 4s is more preferably 30 wt % or less with respect to the mixing amount of the perovskite structure particles 4p. On the other hand, when the mixing amount of the inorganic semiconductor particles 4s decreases, there is concern that an effect of the charge as a transporting material in the radiation absorption layer 4 may be deteriorated. Therefore, the mixing amount of the inorganic semiconductor particles 4s is more preferably 10 wt % or more with respect to the mixing amount of the perovskite structure particles 4p.

A ratio $C_B/C_A$ of a film density $C_B$ of the radiation absorption layer 4 to a density $C_A$ of the perovskite structure particle 4p is preferably 0.2 to 0.98. From the viewpoint of improvement of a mobility of the charge generated due to the absorption of the X-rays and absorption efficiency of the X-rays, the ratio is more preferably 0.5 or more. However, when the mixing amount of the inorganic semiconductor particles 4s decreases, there is concern that an effect of the charge as a transporting material in the radiation absorption layer 4 may be degraded. Therefore, the ratio $C_B/C_A$ is more preferably 0.95 or less.

According to the radiation detector 1B described above, the same advantageous effects as those of the radiation detector 1A described above are achieved.

Further, in the radiation detector 1B, the radiation absorption layer 4 further contains inorganic semiconductor particles 4s, in addition to the perovskite structure particles 4-p and the binder resin 4r. Accordingly, it is possible to increase the mobility of charge (electrons and holes) generated due to the absorption of the X-rays, and to obtain sufficient sensitivity and response characteristics.

It is necessary to thicken the radiation absorption layer 4 in order to improve the absorption efficiency of the X-rays, but a distance to the charge collection electrode 13 increases, and there is concern that charge collection efficiency may decrease. The radiation absorption layer 4 containing the inorganic semiconductor particles 4s is particularly important in solving such a problem.

Further, in the radiation detector 1B, the average particle diameter of the perovskite structure particles 4p is larger than the average particle diameter of the inorganic semiconductor particles 4s. Accordingly, it is possible to improve X-ray absorption efficiency and sensitivity.

Further, in the radiation detector 1B, the conductivity type of the inorganic semiconductor particle 4s and the conductivity type of the dense layer 2 and the porous layer 3 are the same n type. Thus, the electrons generated in the radiation absorption layer 4 due to the absorption of the X-rays can be more smoothly moved to the charge collection electrode 13.

Third Embodiment

Figure 4:
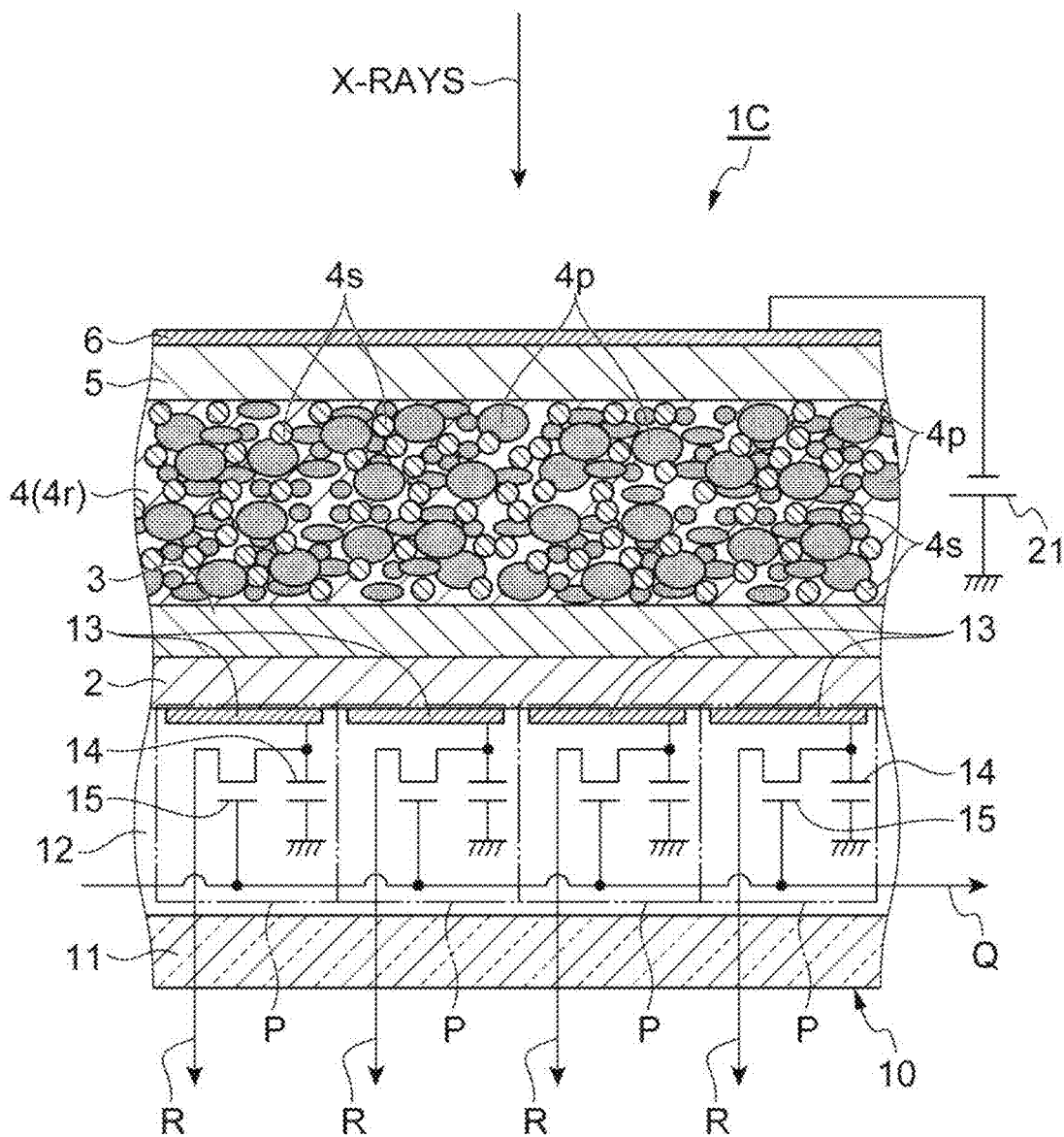
FIG. 4 is a partial cross-sectional view of a radiation detector according to a third embodiment of the present disclosure.

As illustrated in FIG. 4, a radiation detector 1C is different from the radiation detector 1A in the configuration of the radiation absorption layer 4. In the radiation detector 1C, the radiation absorption layer 4 further contains inorganic semiconductor particles 4s, in addition to the perovskite structure particles 4p and the binder resin 4r. The inorganic semiconductor particles 4s are formed of an n-type semiconductor material. That is, a conductivity type of the inorganic semiconductor particle 4s is the same as the conductivity type of the dense layer 2 and the porous layer 3. As the n-type semiconductor material, an oxide such as titanium, silicon, zinc, niobium, tin, or aluminum, a sulfide thereof, a halide thereof, or the like is suitable. The inorganic semiconductor particles 4s increase the mobility of the charge generated in the radiation absorption layer 4 due to the absorption of the X-rays.

Note that in the radiation absorption layer 4 containing the perovskite structure particles 4p, electrons have higher mobility than holes. Therefore, it is preferable for an n-type semiconductor material to be selected as the material of the inorganic semiconductor particles 4s. The inorganic semiconductor particles 4s formed of $TiO_2$, $SiO_2$, $GeO_2$, or the like are particularly preferable from the viewpoint of increase of the mobility of the electrons. The inorganic semiconductor particles 4s also function as nuclei for crystal growth of the perovskite material.

The method of manufacturing the radiation detector 1C is the same as the method of manufacturing the radiation detector 1A described above except that the perovskite structure particles 4p and the inorganic semiconductor particles 4s are added to the solution in which the binder resin 4r has been dissolved, and are completely dissolved to adjust the coating liquid containing the perovskite structure particles 4p, the inorganic semiconductor particles 4s, the binder resin 4r, and the organic solvent.

That is, $CH_3NH_2I$ and $PbX_2$ are mixed in an organic solvent in a molar ratio of 1:1 to prepare methylammonium lead halide (here, $CH_3NH_3PbX_3$) that is the perovskite structure particle 4p. When $Pb_X2$ has completely reacted in the solution, the solution is distilled to obtain a perovskite structure crystal block formed of the methylammonium lead halide. The perovskite structure crystal block is pulverized to obtain the perovskite structure particle 4p.

Subsequently, the binder resin 4r and the organic solvent are mixed and the binder resin 4r is completely dissolved in the organic solvent. The organic solvent may be any organic solvent capable of dissolving the binder resin 4r, may be formed of one type of solvent, or may be formed of two or more kinds of mixed solvents. Examples of the binder resin 4r may include an acrylic organic resin, polyimide, polyvinyl alcohol, polyethylene, polyester, polycarbonate, or a polyurethane organic resin. Further, examples of the organic solvent include aromatics, ketones, alcohols, glycols, glycol ethers, and ethers.

Subsequently, the perovskite structure particles 4p and the inorganic semiconductor particles 4s are added to the solution in which the binder resin 4r has been dissolved, and are completely dissolved to adjust the coating liquid containing the perovskite structure particles 4p, the inorganic semiconductor particles 4s, the binder resin 4r, and the organic solvent.

In the radiation absorption layer 4, an average particle diameter of the perovskite structure particles 4p is larger than an average particle diameter of the inorganic semiconductor particles 4s. The average particle diameter of the inorganic semiconductor particles 4s is preferably 1 nm to 200 μm. However, when the average particle diameter of the inorganic semiconductor particles 4s is 10 nm or less, cohesion of the inorganic semiconductor particles 4s may occur and the dispersibility of the inorganic semiconductor particles 4s in the radiation absorption layer 4 may deteriorate. Therefore, the average particle diameter of the inorganic semiconductor particles 4s is more preferably 50 nm or more. Further, from the viewpoint of suppression of occurrence of crosstalk between the adjacent charge collection electrodes 13, the average particle diameter of the inorganic semiconductor particles 4s is preferably 50% or less of a pixel pitch of the panel 10 (a distance between centers of the adjacent charge collection electrodes 13). A pulverizing method using a ball mill or a mortar, a sifting method, or the like can be appropriately used to obtain the inorganic semiconductor particles 4s having a desired average particle diameter.

When the average particle diameter of the inorganic semiconductor particles 4s is larger than the average particle diameter of the perovskite structure particles 4p, a bulk density at the time of mixing decreases, which causes a decrease in the film density after drying. In order for the inorganic semiconductor particles 4s to fill gaps between the perovskite structure particles 4p and contribute to improvement of the bulk density, it is necessary for the average particle diameter of the inorganic semiconductor particles 4s to be smaller than the average particle diameter of the perovskite structure particles 4p. The average particle diameter of the inorganic semiconductor particles 4s is preferably 1/50 to 1/2 of the average particle diameter of the perovskite structure particles 4p.

The mixing amount of the inorganic semiconductor particles 4s is preferably 70 wt % or less with respect to the mixing amount of the perovskite structure particles 4p. When the mixing amount of the inorganic semiconductor particles 4s increases, there is concern that a resistance value of the radiation absorption layer 4 may decrease and a dark current may increase, or a film density of the radiation absorption layer 4 may decrease and the absorption efficiency of the X-rays may decrease. Therefore, the mixing amount of the inorganic semiconductor particles 4s is more preferably 30 wt % or less with respect to the mixing amount of the perovskite structure particles 4p. On the other hand, when the mixing amount of the inorganic semiconductor particles 4s decreases, there is concern that an effect of the charge as a transporting material in the radiation absorption layer 4 may be degraded. Therefore, the mixing amount of the inorganic semiconductor particles 4s is more preferably 10 wt % or more with respect to the mixing amount of the perovskite structure particles 4p.

A ratio $C_B/C_A$ of a film density $C_B$ of the radiation absorption layer 4 to a density $C_A$ of the perovskite structure particle 4p is preferably 20 to 98%. From the viewpoint of improvement of a mobility of the charge generated due to the absorption of the X-rays and absorption efficiency of the X-rays, the ratio is more preferably 50% or more. However, when the mixing amount of the inorganic semiconductor particles 4s decreases, there is concern that an effect of the charge as a transporting material in the radiation absorption layer 4 may be degraded. Therefore, the ratio $C_B/C_A$ is more preferably 95% or less.

According to the radiation detector 1C described above, the same advantageous effects as those of the radiation detector 1A described above are achieved.

Further, in the radiation detector 1C, the radiation absorption layer 4 further contains inorganic semiconductor particles 4s, in addition to the perovskite structure particles 4p and the binder resin 4r. Accordingly, it is possible to increase the mobility of charge (electrons and holes) generated due to the absorption of the X-rays, and to obtain sufficient sensitivity and response characteristics.

It is necessary to thicken the radiation absorption layer 4 in order to improve the absorption efficiency of the X-rays, but a distance to the charge collection electrode 13 increases, and there is concern that charge collection efficiency may decrease. The radiation absorption layer 4 containing the inorganic semiconductor particles 4s is particularly important in solving such a problem.

Further, in the radiation detector 1C, the average particle diameter of the perovskite structure particles 4p is larger than the average particle diameter of the inorganic semiconductor particles 4s. Accordingly, it is possible to improve X-ray absorption efficiency and sensitivity.

Further, in the radiation detector 1C, the conductivity type of the inorganic semiconductor particle 4s and the conductivity type of the dense layer 2 and the porous layer 3 are the same n type. Thus, the electrons generated in the radiation absorption layer 4 due to the absorption of the X-rays can be more smoothly moved to the charge collection electrode 13.

Further, in the method of manufacturing the radiation detector 1C, the perovskite structure crystal block is pulverized to obtain the perovskite structure particle 4p. Accordingly, since the perovskite structure particles 4p of which the particle diameter is reduced in a random state can be obtained, a filling rate of the perovskite structure particles 4p in the radiation absorption layer 4 increases. Thus, it is possible to obtain the radiation absorption layer 4 excellent in X-ray absorption efficiency and sensitivity.

The first embodiment, the second embodiment and the third embodiment of the present disclosure have been described above, but the present disclosure is not limited to each of the above-described embodiments. For example, each of the radiation detectors 1A, 1B, and 1C can detect radiation other than X-rays. Further, the radiation detectors 1A, 1B, and 1C may not include the dense layer 2. Each of the radiation detectors 1A, 1B, and 1C may not include the porous layer 3. Each of the radiation detectors 1A, 1B, and 1C may not include the hole transport layer 5. In each of the radiation detector 1A, 1B, and 1C, the porous layer 3 may be formed of an insulating material, such as $AL_2O_3$.

Further, the bias voltage may be applied to the voltage application electrode 6 so that a positive potential difference is generated between the voltage application electrode 6 and the charge collection electrode 13. In this case, in the radiation detector 1A, it is preferable for the dense layer 2 and the porous layer 3 to be formed of a p-type semiconductor material (for example, copper oxide ($Cu_2O$, CuO), nickel oxide (NiO), or cobalt oxide (CoO, $Co_3O_4$). In each of the radiation detectors 1B and 1C, it is preferable for the inorganic semiconductor particles 4s among the dense layer 2, the porous layer 3, and the radiation absorption layer 4 to be formed of a p-type semiconductor material (for example, copper oxide ($Cu_2O$, CuO), nickel oxide (NiO), or cobalt oxide (CoO, $Co_3O_4$). In each of the radiation detector 1A, 1B, and 1C, the charge collection electrode 13 collects the holes generated in the radiation absorption layer 4 due to the absorption of the X-rays.

REFERENCE SIGNS LIST 1A, 1B, 1C . . . radiation detector, 2 . . . dense layer (semiconductor charge collection layer), 3 . . . porous layer (semiconductor charge collection layer), 4 . . . radiation absorption layer, 4p . . . perovskite structure particle, 4r . . . binder resin, 4s . . . inorganic semiconductor particle, 5 . . . hole transport layer, 6 . . . voltage application electrode, 10 . . . panel (substrate), 13 . . . charge collection electrode.

The invention claimed is:

1. A radiation detector comprising:
a substrate including a charge collection electrode;
a radiation absorption layer disposed on one side with respect to the substrate and including perovskite structure particles and a binder resin; and
a voltage application electrode disposed on the one side with respect to the radiation absorption layer, a bias voltage being applied to the voltage application electrode so that a potential difference is generated between the voltage application electrode and the charge collection electrode.

2. The radiation detector according to claim 1, wherein the radiation absorption layer further includes inorganic semiconductor particles other than the perovskite structure particles.

3. The radiation detector according to claim 2, wherein an average particle diameter of the perovskite structure particles is larger than an average particle diameter of the inorganic semiconductor particles.

4. The radiation detector according to claim 2, further comprising a semiconductor charge collection layer disposed between the substrate and the radiation absorption layer.

5. The radiation detector according to claim 4, wherein a conductivity type of the inorganic semiconductor particles and a conductivity type of the semiconductor charge collection layer are the same.

6. The radiation detector according to claim 1, further comprising a hole transport layer disposed between the radiation absorption layer and the voltage application electrode.

7. A method of manufacturing a radiation detector, the method comprising:
preparing a coating solution containing perovskite structure particles, a binder resin, and an organic solvent;
forming a radiation absorption layer on one side with respect to a substrate including a charge collection electrode through screen printing using the coating solution after the preparing of the coating solution, the radiation absorption layer containing the perovskite structure particles and the binder resin; and
forming a voltage application electrode on the one side with respect to the radiation absorption layer after the forming of the radiation absorption layer, a bias voltage being applied to the voltage application electrode such that a potential difference is generated between the voltage application electrode and the charge collection electrode.

8. The method according to claim 7, further comprising pulverizing a perovskite structure crystal block to obtain the perovskite structure particles before the preparing of the coating solution.

* * * * *